(12) United States Patent
Chaudhary et al.

(10) Patent No.: US 6,184,134 B1
(45) Date of Patent: Feb. 6, 2001

(54) DRY PROCESS FOR CLEANING RESIDUES/ POLYMERS AFTER METAL ETCH

(75) Inventors: Nirmal Chaudhary, Wappingers Falls; Xian J. Ning, Mohegan Lake; George Stojakovic, Poughkeepsie, all of NY (US)

(73) Assignee: Infineon Technologies North America Corp., San Jose, CA (US)

( * ) Notice: Under 35 U.S.C. 154(b), the term of this patent shall be extended for 0 days.

(21) Appl. No.: 09/506,892

(22) Filed: Feb. 18, 2000

(51) Int. Cl.[7] .................................................. H01L 21/44
(52) U.S. Cl. ........................ 438/669; 438/672; 438/720; 438/725; 438/906
(58) Field of Search .................................. 438/597, 622, 438/672, 669, 720, 725, 906

(56) References Cited

U.S. PATENT DOCUMENTS

| | | | | |
|---|---|---|---|---|
| 5,174,856 | * | 12/1992 | Hwang et al. | 156/643 |
| 5,200,031 | * | 4/1993 | Latchford et al. | 156/659.1 |
| 5,221,424 | * | 6/1993 | Rhoades | 156/643 |
| 5,709,755 | * | 1/1998 | Kuo et al. | 134/1.3 |
| 5,770,523 | * | 6/1998 | Hung et al. | 438/725 |
| 5,780,359 | * | 7/1998 | Brown et al. | 438/659 |
| 5,952,157 | * | 9/1999 | Kato et al. | 430/329 |
| 6,080,526 | * | 6/2000 | Yang et al. | 430/296 |

OTHER PUBLICATIONS

Del Puppo et al., Photoresist Removal Using Gaseous Sulfur Trioxide Cleaning Technology, 3677 (Pt. 2) Proc. SPIE–Int. Soc. Opt. Eng. At 1034–1045 (1999).

* cited by examiner

Primary Examiner—John F. Niebling
Assistant Examiner—Lynne Gurley
(74) Attorney, Agent, or Firm—Stanton Braden

(57) ABSTRACT

An all dry, low temperature process, for complete removal of organics and inorganic residues after metal etch of a microelectronic device comprising: rinsing a microelectronic device having a metallization layer after metal etch with a solution of ammonium hydroxide and hydrogen peroxide; subjecting the rinsed metallization layer to a low temperature GaSonics cleaning by exposing photoresist residue surface of the metallization layer to a fluorine containing reactive gas to form volatile compounds in the presence of a radio frequency input followed by photoresist stripping in an oxygen plasma at low temperature; subjecting the low temperature GaSonics treated residue surface to a gaseous $SO_3$ strip at low temperature to remove additional residue; and rinsing the $SO_3$ stripped material with de-ionized water to remove any remaining resist and residue.

12 Claims, 1 Drawing Sheet

DRY PROCESS FOR CLEANING RESIDUES/POLYMERS AFTER METAL ETCH

BACKGROUND OF THE INVENTION

1. Field of Invention

The present invention relates to a method for an all-dry low temperature process for removal of inorganic, organic and polymer residues on the top surface and sidewalls of a semiconductor wafer after the metal etch.

2. Description of Related Art

In the semiconductor wafer manufacturing art, removal of photoresist is generally accomplished by using a combination of dry and wet processes. For example, a typical photoresist removal procedure comprises the use of an oxygen-plasma ashing followed by a wet chemical clean step using an organic solvent at high temperature.

During the ashing step the organic matrix of the photoresist is removed, thereby leaving metal-ion contaminates particles and un-ashable polymers behind. Consequently, a wet clean is generally needed to remove these leftover residues. The "wet clean" removal of these residues requires organic solvents and other hazardous, reactive chemicals such as concentrated sulfuric acid. Nevertheless, in all to many instances, these residues still persist and remain present on the wafer surface or the etched features.

Accordingly, removal after metal etch has always been a significant challenge. Further, the high temperature ash resulting from oxygen plasma ashing causes oxidation of polymeric residues (especially inorganic residues) thereby making it more difficult to remove.

Del Puppo et al., *Photoresist Removal Using Gaseous Sulfur Trioxide Cleaning Technology*, 3677 (Pt. 2) Proc. SPIE-Int. Soc. Opt. Eng. At 1034–1045 (1999) disclose a process for photoresist removal using $SO_3$ is disclosed. This non-plasma method uses anhydrous sulfur trioxide gas in a two-step process, during which, the substrate is first exposed to $SO_3$ vapor at low temperatures <150° C. and then rinsed with de-ionized (DI) water. The removal of the modified photoresist takes place during the subsequent DI water rinse step.

While the Del Puppo et al. $SO_3$ process removes photoresist and polymer residues, as is confirmed in the disclosure of U.S. Pat. No. 5,952,157, this method for removing a photoresist film using anhydrous $SO_3$, more often than not, does not remove inorganic elements (see FIG. 9 and column 1, lines 34–50).

A method for removal of photoresist residue after dry metal etch without requiring excessive high temperatures or extensive re-work cycles is disclosed in U.S. Pat. No. 5,770,523. However, this method for removal of the surface layer of the residual photoresist mask pattern for metal subtractive etching employs fluorine-containing reactive gases to form volatile compounds with the surface layer, and subsequently uses conventional oxygen plasma stripping to complete resist residue removal, and is encumbered by the detriments of using conventional oxygen plasma stripping processes.

A process for polymer removal from top surfaces and side walls of a semiconductor wafer is disclosed in U.S. Pat. No. 5,780,359 in which the photoresist and residue are processed simultaneously by a chemical mechanism comprising reactive species derived from a microwave-excited fluorine-containing gas and a physical mechanism comprising ion bombardment resulting from a radio frequency excited plasma.

U.S. Pat. No. 5,709,755 disclose a method for chemical-mechanical polishing (CMP) of a wafer comprising: passing the wafer from a CMP polishing station to a APM rinse station (APM is a solution of ammonium hydroxide and hydrogen peroxide in water); brushing and rinsing (with APM) both sides of the wafer, to thereby remove a large part of the CMP residue; passing the wafer to a DI (de-ionized water) rinse station, and brushing and rinsing (with DI) both sides of the wafer, thereby removing yet more of the CMP residue.

In the art of residue removal after metal etch, in which the use of anhydrous $SO_3$ gas followed by rinsing with de-ionized water is not a reliable method for removing resist films containing inorganic elements, and in which dry etching methods are known to give rise to plasma irradiation damage, and in which plasma ashing involves high substrate temperatures (>180° C.) which tends to enhance the problem of drive-in contaminates, and in which chemically modified top layers of the resist in which the crust is too hard to remove using standard oxygen plasma, and in which the use of fluorine addition to the plasma enhances the ashing capability that often results in substrate damage, there is a need to by-pass, avoid, or eliminate these drawbacks after metal etch.

SUMMARY OF THE INVENTION

One object of the present invention is to provide an all dry low temperature process sequence for removing resist residue that avoids high temperature ashing and renders residues water soluble.

A further object of the present invention is to provide an all dry low temperature process for removal of a resist film after metal etch that removes inorganic elements.

A still further object of the present invention is to provide an all dry low temperature process for removal of resist residue after metal etch that avoids utilizing plasma/wet processes for removing photoresist that give rise to plasma irradiation damage, avoids high temperature plasma ashing that involves high substrate temperatures (>180° C.) that enhance the problem of drive-in contaminates (and causes chemically modified top layers of resist in which the crust is too hard to be removed); and avoids wet chemical processes using organic solvents that significantly increase the cost of operation and chemical disposal.

In general, the invention is accomplished by: subjecting a semiconductor wafer having a metallization layer to a APM rinse; subjecting the APM rinse treated layer to a low temperature GaSonics cleaning using $CF_4$; and subjecting the GaSonics/$CF_4$ cleaned wafer to a anhydrous $SO_3$ gas strip at low temperatures followed by rinsing the wafer with de-ionized water.

DESCRIPTION OF THE PREFERRED EMBODIMENTS

Figure 1:
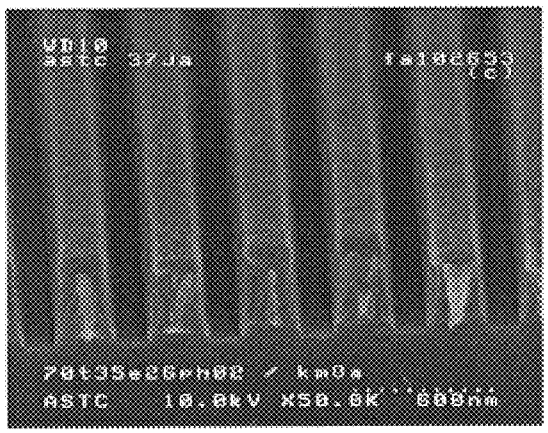
FIG. 1 is an optical and scanning electron microscope (SEM) picture showing a post metal strip result for coarse and fine detection of residues after subjecting a semiconductor wafer metalization layer to an APM rinse, prior to the low temperature GaSonics cleaning step.

In semiconductor wafer manufacturing, residue and photoresist removal have always posed a problem. In addressing this problem, the traditional approach after metal etch is to affect resist strip followed by a wet chemical clean- and this is common to most back-in levels.

The problem is in part due to the fact that the high temperature oxygen plasma ashing followed by the wet chemical clean causes oxidation of polymeric and other residues (especially inorganic residues), and this oxidation makes it difficult to remove polymeric and inorganic residues.

Therefore, an all dry method that is free from the use of solvents from wet cleaning methods and capable of removing polymeric, organic and inorganic residues, and that avoids the high temperature ashing, but renders both organics and inorganic residues water soluble is the sought for solution in removal of photoresist and other residue after metal etch.

Most of the investigation in this field has been directed to the optimization of wet chemical clean process/chemistry to enhance yield and improve electromigration. However, despite these investigations and research, the problem of corrosion, mouse bits along a metal sidewall and residues still persists.

The fundamental problem is that metal etch is followed by in situ resist strip at high temperatures (up to 250° C.) using down stream oxygen plasma. Although the in situ resist strip helps prevent corrosion of metal lines by virtue of residual chlorine ions remaining after reactive ion etching (RIE), the high temperature ashing remains a problem. It remains a problem because resist strip at high temperature causes inorganic residues (present in the resist or generated during the RIE process) to oxidize, thereby making it difficult to remove by most of the wet clean processes. In instances where these residues sometimes get removed from the side-wall and or bottom of metal lines, they are re-deposited on top of metal lines (metal rails), thereby causing shorts and other non-reliability issues.

While it has been well recognized among researches that high temperature ashing should be avoided, it is also a fact that a viable method to get rid of all inorganic as well as organic residues has not yet been achieved with or without the high temperature ashing followed by a wet chemical clean step.

The invention provides an all dry or non-solvent process sequence for cleaning residues (inclusive of polymeric, organic and inorganic) after metal etch of semiconductor wafers and other microelectronic devices.

The process sequence removes all organic as well inorganic residues by using an all dry method that eliminates the need of a wet chemical clean post resist strip.

The all dry process for cleaning residues/polymers after the metal etch is accomplished by rinsing the microelectronic device or integrated circuit containing photoresist residues with a solution of ammonium hydroxide and hydrogen peroxide in water (APM); subjecting the APM rinsed material to a low pressure microwave stripper performance enhancement platform (PEP) process at a low temperature of about 55° C. using $CF_4$ chemistry to replace chlorides by AlF, to prevent corrosion; subjecting the low temperature GaSonics PEP clean to a gas phase $SO_3$ strip at about 40° C.; and rinsing the device with de-ionized water.

In the Figures hereinafter referred to, metal layers have been deposited on a thick layer of a dielectric oxide. Prior to metal deposition vias or holes are etched into the dielectric at regular intervals. These vias are filled with Tungsten metal and polished to form metal studs for interconnecting adjacent layers of metals. Although the vias are not shown in the Figures, they are nevertheless placed strategically at regular intervals to form interconnects.

Referring now to the SEM micrograph of FIG. 1, there is shown a metal etched substrate with first level metal lines after an in situ metal etch subsequent to the APM rinse and prior to the GaSonics PEP (Performance Enhancement Platform) clean.

From FIG. 1, the polymers sticking from the side of the metal lines (metal rails can be seen).

Figure 2:
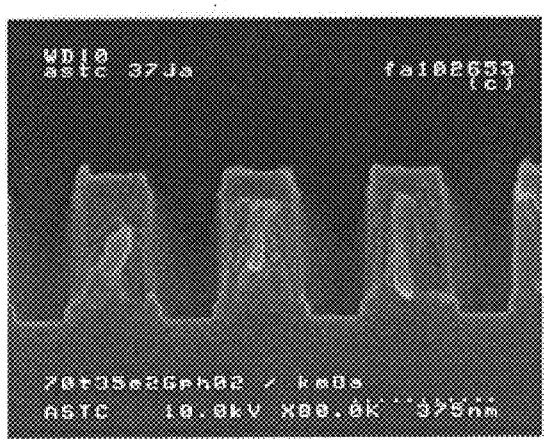
FIG. 2 shows a SEM picture of a post metal strip result for coarse and fine detection of residues after treating the semiconductor wafer metallization layer to low and high temperature GaSonics cleaning subsequent to the APM rinse.

In FIG. 2, some metal lines can still be seen after the GaSonics resist strip sequence for 35 seconds at a low temperature of 55° C. followed by a high temperature of (250° C.) bulk resist strip for 60 seconds in a second chamber on the same tool platform. It is apparent from FIG. 2 that the metal lines are more distinct and represent a greater extent of resist removal (as some polymers can still be seen sticking from the side of the metal lines even after employing multiple steps of resist strip and water clean) than is shown in FIG. 1.

Figure 3:
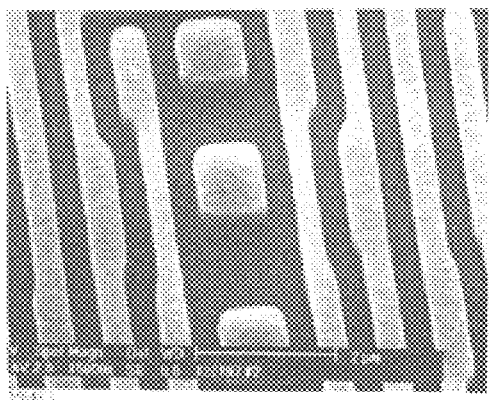
FIG. 3 is a SEM picture showing a post metal strip result for coarse and fine detection of residues after treating the semiconductor wafer metallization layer with anhydrous $SO_3$ gas stripping at low temperatures, followed by a de-ionized water rinse, subsequent to the low-temperature GaSonics cleaning step.

FIG. 3 is a SEM picture resulting from the invention process sequence where high temperature strip is completely avoided. In this process the metal etch is followed by an in situ wet DI rinse. The in situ resist strip process is by passed. After the in situ wet DI rinse, the wafer is subjected to a gas phase $SO_3$ strip process. In the gas phase $SO_3$ strip process, the wafer is exposed to $SO_3$ gas for 180 seconds at 40° C. at a pressure of 80 Torr, followed by a standard DI rinse. There was no solvent clean (a completely dry process). Since metal corrosion is always an issue, after the $SO_3$ strip and DI water rinse, the wafer was subjected to a corrosion environment by placing it in a sealed water box [standard corrosion test experiment] and left for 3 weeks. Samples of the wafer were observed under a scanning electron microscope [SEM]. 0.25-micrometer metal lines were observed for signs of corrosion. No metal corrosion was present.

As can be seen from FIG. 3, there is a clean surface of metal lines. Also, no metal rails were observed.

The invention process sequence is simpler than that of the prior art and more readily acceptable in a manufacturing environment since the hazards and cost involved in solvent processing (wet processing) is eliminated or polymer removal is accomplished without an added wet clean step.

While the invention is described with reference to preferred embodiments, one skilled in the art will appreciate that modifications and substitutions for those embodiments specifically set forth herein can be made without departing from the spirit and scope of the present invention. Accordingly, the invention is limited only by the claims included hereinbelow.

We claim:

1. An all dry, low temperature process, for complete removal of organics and inorganic residues after metal etch of a microelectronic device comprising: rinsing a microelectronic device having a metallization layer after metal etch with a solution of ammonium hydroxide and hydrogen peroxide; subjecting the rinsed metallization layer to a low temperature GaSonics cleaning by exposing photoresist residue surface of said metallization layer to a fluorine containing reactive gas to form volatile compounds in the presence of a radio frequency input followed by photoresist stripping in an oxygen plasma at low temperature; subjecting the low temperature GaSonics treated residue surface to a gaseous $SO_3$ strip at low temperature to remove additional residue; and rinsing the $SO_3$ stripped material with de-ionized water to remove any remaining resist and residue.

2. The process of claim 1 wherein said low temperature GaSonics cleaning is at about 55° C. and said low temperature gaseous $SO_3$ strip is about 40° C.

3. The process of claim 2 wherein said microelectronic device is a metal layer deposited on a layer of dielectric oxide having vias filled with Tungsten.

4. The process of claim 3 wherein said fluorine containing reactive gas that forms volatile compounds is selected from the group consisting of $CF_4$, $SF_6$ or mixtures thereof.

5. The process of claim 4 wherein said fluorine containing reactive gas that forms volatile compounds is $CF_4$.

6. The process of claim 5 wherein said GsSonics cleaning is for about 35 seconds, and said gaseous $SO_3$ strip is for about 180 seconds at a pressure of about 80 Torr.

7. A microelectronic device prepared by the process of claim 1.

8. A microelectronic device prepared by the process of claim 2.

9. A microelectronic device prepared by the process of claim 3.

10. A microelectronic device prepared by the process of claim 4.

11. A microelectronic device prepared by the process of claim 5.

12. A microelectronic device prepared by the process of claim 6.

* * * * *